(12) United States Patent
Niederkorn et al.

(10) Patent No.: US 8,384,604 B2
(45) Date of Patent: Feb. 26, 2013

(54) INTEGRATED ANTENNA AND EMI SHIELDING SUPPORT MEMBER FOR PORTABLE COMMUNICATIONS TERMINALS

(75) Inventors: Reed Niederkorn, Saint Louis, MO (US); Torsten Ostervall, Stockholm (SE)

(73) Assignee: Laird Technologies, Inc., Earth City, MO (US)

( * ) Notice: Subject to any disclaimer, the term of this patent is extended or adjusted under 35 U.S.C. 154(b) by 304 days.

(21) Appl. No.: 12/906,767

(22) Filed: Oct. 18, 2010

(65) Prior Publication Data

US 2011/0025575 A1    Feb. 3, 2011

Related U.S. Application Data

(63) Continuation-in-part of application No. PCT/US2009/040931, filed on Apr. 17, 2009.

(60) Provisional application No. 61/045,939, filed on Apr. 17, 2008.

(51) Int. Cl.
*H01Q 1/24* (2006.01)

(52) U.S. Cl. .................................. 343/702; 343/841

(58) Field of Classification Search .................. 343/702, 343/700 MS, 841
See application file for complete search history.

(56) References Cited

U.S. PATENT DOCUMENTS

| 6,275,683 B1 * | 8/2001 | Smith | 455/575.1 |
| 6,426,881 B1 * | 7/2002 | Kurz | 361/800 |
| 6,576,832 B2 * | 6/2003 | Svarfvar et al. | 174/392 |
| 6,940,010 B2 | 9/2005 | Cunningham et al. | |
| 8,265,329 B2 * | 9/2012 | Lin et al. | 381/386 |

FOREIGN PATENT DOCUMENTS

| JP | 2001-268190 | 9/2001 |
| KR | 20-0128863 | 8/1998 |
| KR | 10-2006-0026456 | 3/2006 |
| TW | 2010-10384 | 3/2010 |
| WO | WO 2009/129446 | 10/2009 |
| WO | WO 2009/129447 | 10/2009 |

OTHER PUBLICATIONS

International Search Report dated Nov. 27, 2009, issued by the International Search Authority for International Patent Application No. PCT/US2009/040931, 3 pages.

Written Opinion dated Nov. 27, 2009, issued by the International Search Authority for International Patent Application No. PCT/US2009/040931, 4 pages.

* cited by examiner

*Primary Examiner* — Hoanganh Le
(74) *Attorney, Agent, or Firm* — Harness, Dickey & Pierce, P.L.C.

(57) ABSTRACT

According to various aspects, exemplary embodiments are provided of portable communications terminals and assemblies thereof. In one exemplary embodiment, a portable communications terminal includes a support member. An antenna is supported by the support member. Electromagnetic interference (EMI) shielding structure is also supported by the support member. A printed circuit board includes one or more electronic components mounted thereon. The EMI shielding structure is operable for providing EMI shielding for one or more electronic components that are disposed within the interior defined by the EMI shielding structure and the printed circuit board.

26 Claims, 4 Drawing Sheets

INTEGRATED ANTENNA AND EMI SHIELDING SUPPORT MEMBER FOR PORTABLE COMMUNICATIONS TERMINALS

CROSS-REFERENCE TO RELATED APPLICATIONS

This application is a continuation-in-part of International Application No. PCT/US2009/040931 filed Apr. 17, 2009 (published as WO 2009/129447 on Oct. 22, 2009), which, in turn, claimed the benefit of U.S. Provisional Application No. 61/045,939 filed Apr. 17, 2008. The entire disclosure of each of the above applications is incorporated herein by reference in its entirety.

FIELD

The present disclosure generally relates to portable communications terminals, such as cellular phones. More specifically, the present disclosure relates to portable communications terminals having an internal frame or middle deck that supports both the antenna for receiving and transmitting signals and the shield that provides electromagnetic interference (EMI) shielding for board-mounted electronic components of a printed circuit board (PCB).

BACKGROUND

This section provides background information related to the present disclosure which is not necessarily prior art.

Portable wireless communications terminals (e.g., cellular phones with built-in digital cameras, etc.) have become increasingly popular. With increasing popularity, the number of users and their particular preferences and tastes in regard to functionality and operation of the devices have also increased, such as different user preferences as to how the device is opened and closed. In response to user demand, different types of portable terminals have been developed, such as bar type, flip type, flip-up type, and folder type.

In addition, slider type terminals have also been introduced. Slider type terminals can be equipped with an LCD module display device having a similar size as the LCD module display device commonly provided with the folder type terminals. Slider mechanisms may help contribute to size reduction or miniaturization of portable terminals into which they are incorporated. Conventional slider type terminals include a sub-body or cover that may be slidably opened and closed on a main body.

As with other electronic equipment, the electronic components of cellular phone's PCB generate electromagnetic signals that may radiate to and interfere with other electronic components internal or external to the cellular phone. This electromagnetic interference (EMI) can cause degradation of signals, thereby rendering the cellular phone or adjacent electronic equipment inefficient. To reduce the adverse effects of EMI, electrically conducting material is interposed between the electronic circuitry for absorbing and/or reflecting EMI energy. This shielding may take the form of a complete enclosure (e.g., a single-piece board level shielding (BLS) can or enclosure, two-piece BLS shield, etc.) which may be placed around the electronic components of the PCB that generate electromagnetic signals and/or that may be susceptible to electromagnetic signals. For example, electronic circuits or components of a printed circuit board of a slider-type cellular phone are often enclosed within the top cover or lid and sidewalls of a BLS can in order to localize EMI within its source and/or to insulate the PCB electronic circuits or components from external EMI sources. Typically, the BLS can is a separately manufactured single-piece component that is separately installed between the PCB and the slide assembly. For example, the BLS can is typically mounted (e.g., soldered, etc.) to the PCB before the PCB is attached to the slider mechanism. After installation of the BLS can, the PCB may then be attached to the slider mechanism.

As used herein, the term electromagnetic interference (EMI) should be considered to generally include and refer to both electromagnetic interference (EMI) and radio frequency interference (RFI) emissions. The term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a shielding device in which electronic equipment is disposed.

SUMMARY

This section provides a general summary of the disclosure, and is not a comprehensive disclosure of its full scope or all of its features.

According to various aspects, exemplary embodiments are provided of portable communications terminals and assemblies thereof. In an exemplary embodiment, a portable communications terminal includes a support member. An antenna is supported by the support member. Electromagnetic interference (EMI) shielding structure is also supported by the support member. A printed circuit board includes one or more electronic components mounted thereon. The EMI shielding structure is operable for providing EMI shielding for one or more electronic components that are disposed within the interior defined by the EMI shielding structure and the printed circuit board.

Other exemplary embodiments provide assemblies for portable communications terminals, that have printed circuit boards with one or more electronic components mounted thereon. In an exemplary embodiment, an assembly generally includes a support member. An antenna is supported by the support member. EMI shielding structure is also supported by the support member. The EMI shielding structure is operable for providing EMI shielding for one or more electronic components disposed within the interior defined by the EMI shielding structure and the printed circuit board.

Other exemplary embodiments include methods relating to portable communications terminals. In an exemplary embodiment, a method generally includes attaching EMI shielding structure directly to a support member for a portable communications terminal. The support member also supports an antenna for receiving and transmitting signals. The EMI shielding structure is operable for providing EMI shielding for one or more electronic components of a printed circuit board of the portable communications terminal. In another exemplary embodiment, a method generally includes positioning a support member relative to a printed circuit board of the portable communications terminal such that EMI shielding structure supported by the support member provides EMI shielding for one or more electronic components of the printed circuit board. In addition to supporting the EMI shielding structure, the support member also supports an antenna for receiving and transmitting signals.

Further areas of applicability will become apparent from the description provided herein. It should be understood that the description and specific examples are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
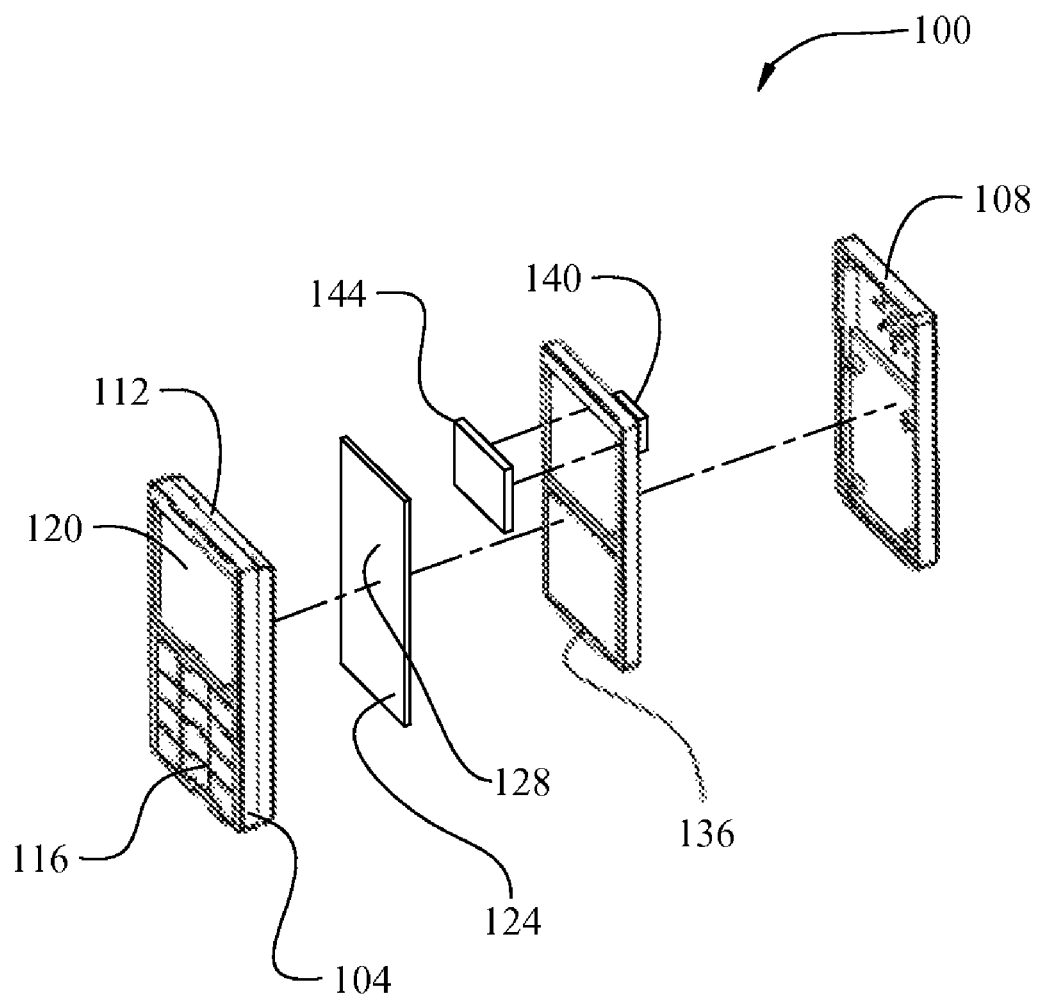
FIG. 1 is an exploded perspective view showing a portable communications terminal having an internal support member to which is attached an antenna and an EMI shield, according to an exemplary embodiment of the present disclosure.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

According to various aspects, exemplary embodiments are provided of portable communications terminals and assemblies thereof. In an exemplary embodiment, a portable communications terminal includes a support member. An antenna is supported by the support member. EMI shielding structure is also supported by the support member. A printed circuit board includes one or more electronic components mounted thereon. The EMI shielding structure is operable for providing EMI shielding for one or more electronic components that are disposed within the interior defined by the EMI shielding structure and the printed circuit board.

Other exemplary embodiments provide assemblies for portable communications terminals, that have printed circuit boards with one or more electronic components mounted thereon. In an exemplary embodiment, an assembly generally includes a support member. An antenna is supported by the support member. EMI shielding structure is also supported by the support member. The EMI shielding structure is operable for providing EMI shielding for one or more electronic components that are disposed within the interior defined by the EMI shielding structure and the printed circuit board.

Other exemplary embodiments include methods relating to portable communications terminals. In an exemplary embodiment, a method generally includes attaching EMI shielding structure directly to a support member for a portable communications terminal. The support member also supports an antenna for receiving and transmitting signals. The EMI shielding structure is operable for providing EMI shielding for one or more electronic components of a printed circuit board of the portable communications terminal.

In another exemplary embodiment, a method generally includes positioning a support member relative to a printed circuit board of the portable communications terminal such that EMI shielding structure supported by the support member provides EMI shielding for one or more electronic components of the printed circuit board. In addition to supporting the EMI shielding structure, the support member also supports an antenna for receiving and transmitting signals.

In various embodiments, the support member is a middle deck to which is mounted the antenna and the EMI shielding structure without any direct physical attachment (e.g., mechanical fasteners, soldering, etching on a PCB, etc.) of the antenna or EMI shielding structure to the printed circuit board. For example, some embodiments do not include any mechanical fasteners or soldering of the EMI shielding structure and/or antenna directly to the PCB.

As recognized by the inventors hereof, total costs and size may be reduced for some portable communications terminals (e.g., cellular phones, etc.) by attaching EMI shielding structure directly to the same middle deck, frame, or support member to which is attached the antenna, instead of mounting the EMI shielding structure directly to the PCB. For example, some exemplary embodiments attach (e.g., weld, etc.) a metal piece (e.g., EMI shielding can or enclosure, etc.) directly to the middle deck, frame, or support member to which is attached a PIFA patch antenna that has etched copper film. By supporting both the antenna and EMI shielding structure from the middle deck, frame, or support member, the inventors hereof have recognized that the overall height of the portable communications terminal may be reduced (e.g., up to about 0.5 millimeter height reduction, etc.) because there is no longer the need to provide extra room or tolerance between the EMI shield soldered to the PCB and the middle deck, frame, or support member, as the EMI shield is not soldered to the PCB. Because the EMI shield is not soldered to the PCB but is instead attached to the middle deck, frame, or support member in embodiments disclosed herein, access to the electronic components on the PCB can be accomplished by detaching and removing the PCB from the middle deck, frame, or support member, thus providing access, for example, to repair, replace, rework, test, etc. the electronic components on the PCB.

In addition, the inventors have also recognized that there is less radio frequency (RF) variation as the tolerance stack between the antenna and the EMI shield is reduced. Plus, the antenna can be tested when the antenna and the EMI shield are both attached to the middle deck, frame, or support member before they are shipped to the original equipment manufacturer (OEM), etc. of the portable communications terminal. Supporting both the antenna and EMI shielding structure from the same middle deck, frame, or support member may also provide a more stable system.

In some embodiments, the EMI shield is attached or mounted to the middle deck, frame, or support by a snap-fit, friction fit, or interference fit connection. This connection may be configured so as to be strong enough to help hold the EMI shield in place relative to the middle deck, frame, or support when the middle deck, frame, or support is being shipped or transported with the EMI shield connected thereto, independent of or without the other components of the portable communications terminal. Alternative embodiments may include other mounting methods, such as mechanical fasteners.

Figure 2:
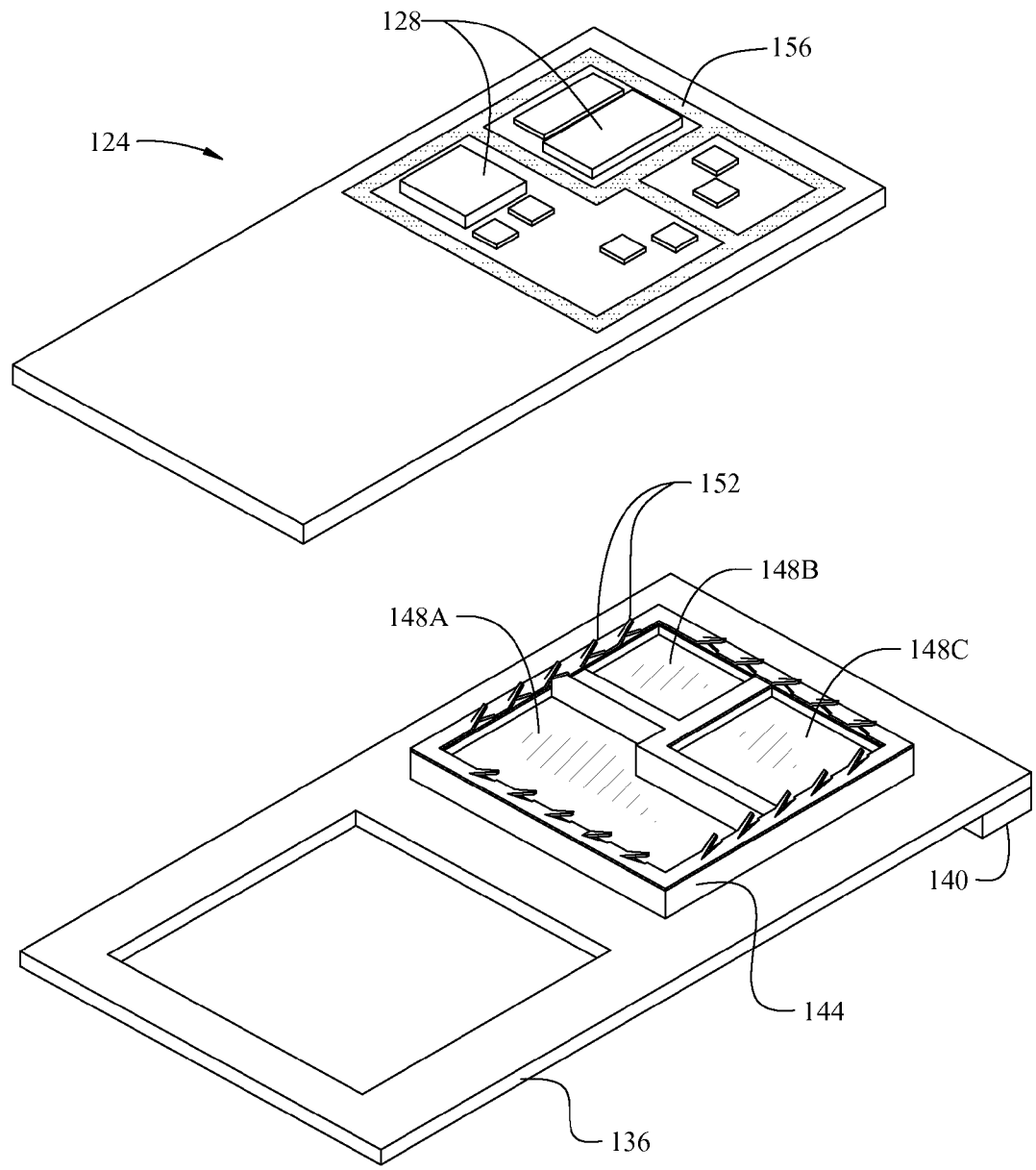
FIG. 2 is a perspective view showing the internal support member with the antenna and EMI shield attached thereto, and the back side of the printed circuit board (shown in FIG. 1) having electronic components thereon, wherein the EMI shield is configured to define EMI shielding compartments that correspond to the layout of the PCB electronic components.
Figure 3:
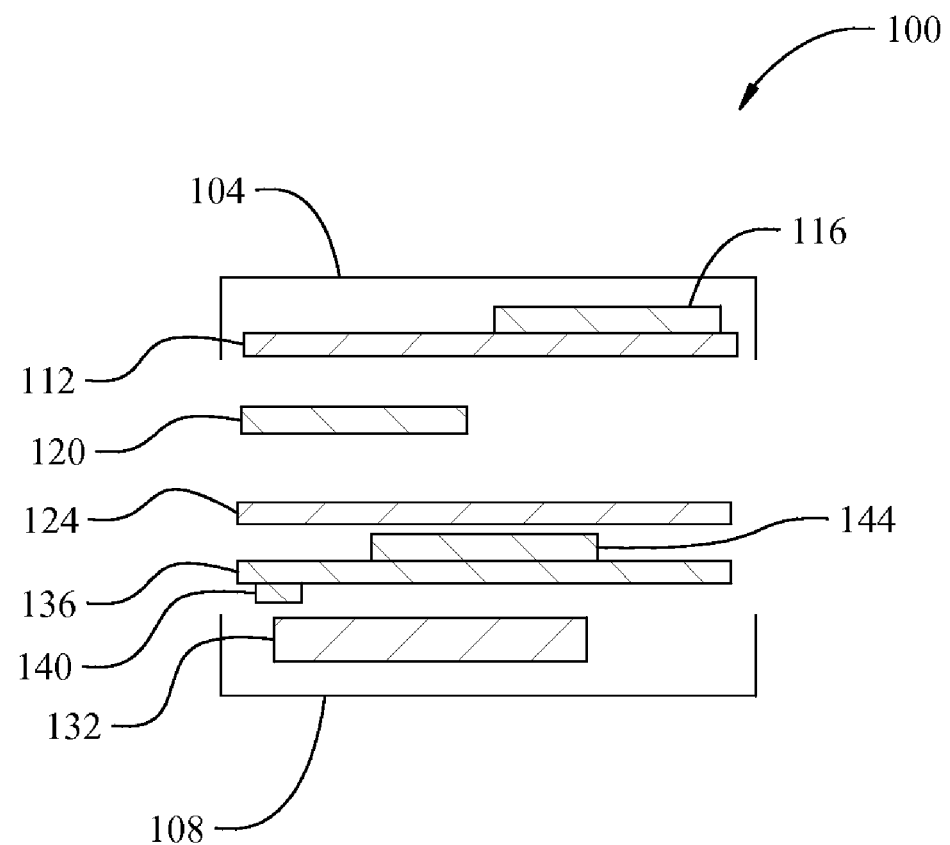
FIG. 3 is a simplified schematic of the components of the portable communications terminal shown in FIG. 1.

With reference now to the figures, FIGS. 1 and 3 illustrate an exemplary portable communications terminal 100. As shown, the portable communications terminal 100 includes front and back covers or housing portions 104 and 108. An internal frame or user interface support 112 is disposed behind the front cover 104. The user interface support 112 may be used to support one or more user interface components, such as a keypad 116, a display device 120 (e.g., LCD display, etc.), etc. The user interface support 112 and front cover 104 may include windows or openings through which the display device 120 is externally visible. The keypad 116 and display device 120 are electrically connected to a PCB 124 having electronic components thereon 128 (the electronic components 128 are shown in FIG. 2). The keypad 116 and display device 120 allow a user to interface with the portable communications terminal 100 for carrying out various functions of the portable communications terminal 100.

Also shown in FIG. 3 is a battery 132 and an internal frame, middle deck, or support member 136. The support member 136 may be formed of a suitable material, such as plastic, a composite material, an electrically non-conductive or dielectric material, etc. As shown in FIGS. 1, 2, and 3, the support member 136 may be used to support an antenna 140 (e.g., PIFA patch antenna having etched copper film, etc.) and EMI shielding structure 144 (the details of which are shown in FIG. 2), among other components.

In the illustrated embodiment, the antenna 140 and EMI shielding structure 144 are attached to opposite sides of the support member 136. By way of example, the antenna 140 may be adhesively attached to the support member 136. Also by way of example, the EMI shielding structure 144 may be attached to the support member 136 by a snap-fit, friction fit, or interference fit connection. For example, the EMI shielding structure 144 may include resilient spring fingers, tabs, or other resilient members for forming the snap-fit, friction fit or interference fit connection. The connection may be configured so as to be sufficiently strong enough to help hold the EMI shielding structure 144 in place relative to the support member 136, for example, when the support member 136 is being shipped or transported with the antenna 140 and EMI shielding structure 144 connected thereto, independent of and without the other components of the portable communications terminal 100. Alternative embodiments may include other means or methods for attaching the antenna 140 and/or EMI shielding structure 144 to the support member 136, such as mechanical fasteners, adhesives, soldering, welding, etc.

In the illustrated embodiment shown in FIG. 2, the EMI shielding structure 144 includes walls extending from a lid portion. The walls are configured (e.g., sized, located, shaped, etc.) to define plurality of individual EMI shielding compartments 148A, 148B, 148C that correspond to the layout of the PCB electronic components 128. Accordingly, the PCB electronic components 128 may thus be positioned in different compartments defined by the EMI shielding structure 144 such that the PCB electronic components 128 are provided with EMI shielding by virtue of the EMI shielding compartments 148 inhibiting the ingress and/or egress of EMI into and/or out of each EMI shielding compartment 148.

The EMI shielding structure 144 is illustrated as being monolithically formed as a single component structure. For example, the EMI shielding structure 144 may be formed by drawing (e.g., over a die, etc.), bending, stamping, folding, etc. Alternative embodiments may include a plurality of separate pieces that are separately attached to the support member 136.

The EMI shielding structure 144 may be formed from various materials, such as electrically-conductive materials like cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the EMI shielding structure 144 may be formed from a plastic material coated with electrically-conductive material.

With continued reference to FIG. 2, the EMI shielding structure 144 includes resilient spring fingers 152. The spring fingers 152 may be configured for contacting electrically-conductive surfaces 156 (as represented by the speckled portions 156) (e.g., ground traces, etc.) of the PCB 124, to provide an electrical grounding pathway or connection between the EMI shielding structure 144 and the PCB 124. A wide range of materials may be used for the EMI shielding structure 144 and fingers 152, preferably electrically-conductive materials having sufficient resiliency or springiness for permitting the spring fingers 152 to be at least partially deflected in the final installed position or assembly. For example, this resiliency may allow the spring fingers 152 to deflect or flex, and then to respond with a sufficient restorative force for biasing the spring fingers 152 against the electrically-conductive surfaces 156 of the PCB 124. This biasing force may help the spring fingers 152 maintain good electrical contact with the PCB 124. In some exemplary embodiments, EMI shielding structures may include formed finger gaskets (e.g., formed by bending, stamping, folding, etc.) made from beryllium copper alloys or other suitable electrically-conductive materials.

In addition, a compressive clamping force may be generated when the various components of the portable communications terminal 100 are assembled. For example, assembly (e.g., mechanical fastening, etc.) of the PCB 124 to the support member 136 or other component(s) may generate a compressive clamping force such that the EMI shielding structure 144 is compressively sandwiched between the PCB 124 and the support member 136. This compressive clamping force may compress the spring fingers 152 against electrically-conductive surfaces 156 (e.g., ground traces, etc.) on the PCB 124, to help establish good electrical conductivity therebetween that is sufficient for EMI shielding performance.

In the illustrated embodiment of FIG. 2, the EMI shielding structure 144 includes a lid portion and plurality of walls extending from the lid portion. In other embodiments, the EMI shielding structure 144 may include the walls only without any lid portion. In these other embodiments, a portion of the support member 136 that resides within a perimeter defined by the EMI shielding structure 144 may be configured (e.g., formed out of a suitable shielding material) to be operable as an EMI shielding lid. In which case, the EMI shielding structure 144 and the corresponding portion of the support member 136 are operable for cooperatively providing EMI shielding for the electronic components disposed within the interior cooperatively defined by the EMI shielding structure 144 and the corresponding portion of the support member 136, and the printed circuit board 124.

Figure 4:
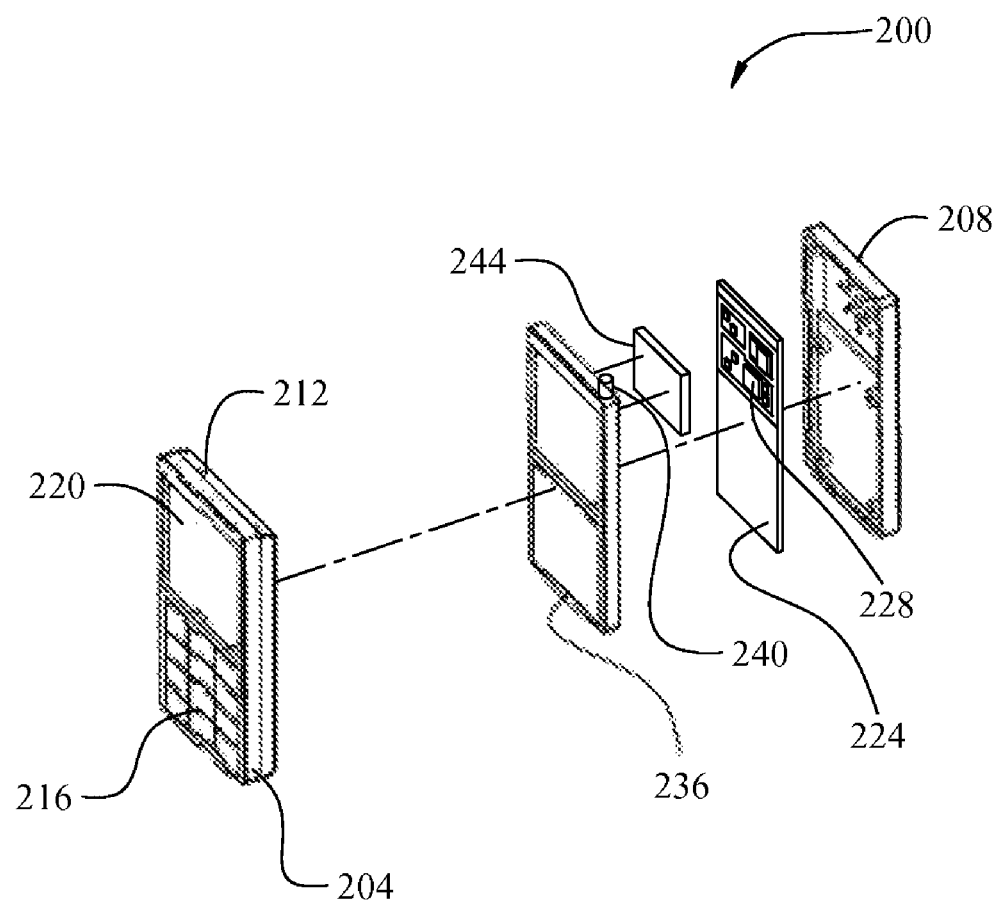
FIG. 4 is an exploded perspective view showing a portable communications terminal having an internal support member to which is attached an antenna and an EMI shield, according to another exemplary embodiment of the present disclosure.

FIG. 4 illustrates a portable communications terminal 200 according to another exemplary embodiment. As shown in FIG. 4, the portable communications terminal 200 includes front and back covers or housing portions 204 and 208. An internal frame or user interface support 212 is disposed behind the front cover 204. The user interface support 212 may be used to support one or more user interface components, such as a keypad 216, a display device 220 (e.g., LCD display, etc.), etc. The user interface support 212 and front cover 204 may include windows or openings through which the display device 220 is externally visible. The keypad 216 and display device 220 are electrically connected to a PCB 224 having electronic components thereon 228. The keypad 216 and display device 220 allow a user to interface with the portable communications terminal 200 for carrying out various functions of the portable communications terminal 200.

Also shown in FIG. 4 is an internal frame, middle deck, or support member 236, which may be formed of a suitable material, such as plastic, a composite material, an electrically non-conductive or dielectric material, etc. The support member 236 may be used to support an antenna 240 (e.g., stub antenna, PIFA patch antenna having etched copper film, etc.) and EMI shielding structure 244, among other components.

By way of example, the antenna 240 may be mechanically fastened via threaded connection to the support member 236. Also by way of example, the EMI shielding structure 244 may be attached to the support member 236 by a snap-fit, friction fit, or interference fit connection. For example, the EMI shielding structure 244 may include resilient spring fingers, tabs, or other resilient members for forming the snap-fit, friction fit or interference connection. The connection may be configured so as to be sufficiently strong enough to help hold the EMI shielding structure 244 in place relative to the support member 236, for example, when the support member 236 is being shipped or transported with the antenna 240 and EMI shielding structure 244 connected thereto, independent of and without the other components of the portable communications terminal 200. Alternative embodiments may include other means or methods for attaching the antenna 240 and/or EMI shielding structure 244 to the support member 236, such as mechanical fasteners, adhesives, soldering, welding, etc.

The EMI shielding structure 244 may include walls configured (e.g., sized, located, shaped, etc.) to define plurality of individual EMI shielding compartments (e.g., compartments 148A, 148B, 148C in FIG. 2, etc.) that correspond to the layout of the PCB electronic components 228. Accordingly, the PCB electronic components 228 will thus be positioned in different compartments defined by the EMI shielding structure 244 such that the PCB electronic components 228 are provided with EMI shielding by virtue of the EMI shielding compartments inhibiting the ingress and/or egress of EMI into and/or out of each EMI shielding compartment.

The EMI shielding structure 244 may be monolithically formed as a single component structure. For example, the EMI shielding structure 244 may be formed by drawing (e.g., over a die, etc.), bending, stamping, folding, etc. Alternative embodiments may include a plurality of separate pieces that are separately attached to the support member 236. The EMI shielding structure 244 may also include one or more spring fingers (e.g., spring fingers 152 shown in FIG. 2, etc.) in some embodiments.

The EMI shielding structure 244 may be formed from various materials, such as electrically-conductive materials like cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the EMI shielding structure 244 may be formed from a plastic material coated with electrically-conductive material.

FIGS. 1 through 4 illustrate exemplary embodiments of portable communications terminals in which aspects of the present disclosure may be incorporated. Aspects of the present disclosure, however, should not be limited solely to these particular devices. For example, aspects of the present disclosure may be incorporated into portable terminals, such as portable communications terminals or devices like cellular phones, personal digital assistants (PDAs), other electronic devices, flip-type portable communications terminals, sliding-type portable communications terminals, rotating-type portable communications terminals, portable communications terminals that are not configured to be opened and closed, etc. within the scope of the present disclosure.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A portable communications terminal comprising:
   front and back housing portions;
   a printed circuit board having one or more electronic components mounted thereon;
   a support member adjacent the printed circuit board and between the front and back housing portions;
   an antenna attached to the support member; and
   electromagnetic interference (EMI) shielding structure attached to the support member;
   whereby the EMI shielding structure is operable for providing EMI shielding for one or more of the electronic components that are disposed within the interior defined by the EMI shielding structure and the printed circuit board.

2. The portable communications terminal of claim 1, wherein the support member is a middle deck.

3. The portable communications terminal of claim 2, wherein:
   the antenna is mounted to the middle deck without any direct physical attachment of the antenna to the printed circuit board; and
   the EMI shielding structure is mounted to the middle deck without any direct physical attachment of the EMI shielding structure to the printed circuit board.

4. The portable communications terminal of claim 1, wherein:
   the support member comprises an internal frame having an opening configured for receiving therein the EMI shielding structure; and
   the antenna and EMI shielding structure are attached directly to the support member without any direct physical attachment to the printed circuit board; and
   the EMI shielding structure and the support member are configured to form a snap-fit, friction fit, or interference fit connection therebetween.

5. The portable communications terminal of claim 1, wherein:
   the support member includes generally oppositely facing first and second sides;
   the antenna is attached directly to the first side of the support member; and
   the EMI shielding structure is attached directly to the second side of the support member.

6. The portable communications terminal of claim 1, wherein:
   the antenna and EMI shielding structure are attached directly to the support member with a spaced distance separating the antenna from the EMI shielding structure; and
   the support member is dielectric; and
   the antenna comprises a PIFA patch antenna having etched copper film that is attached to the support member.

7. The portable communications terminal of claim 1, wherein:
   the EMI shielding structure includes a lid portion and plurality of walls extending from the lid portion; and
   the EMI shielding structure defines two or more EMI shielding compartments corresponding to the layout of the electronic components of the printed circuit board, such that the electronic components are positionable in different EMI shielding compartments; and
   the EMI shielding structure comprises at least one resilient finger extending generally outwardly from the EMI shielding structure towards the printed circuit board, for electrically contacting at least one electrically conductive surface of the printed circuit board; and
   the EMI shielding structure is monolithically formed as a single component structure; and
   the EMI shielding structure is compressively sandwiched between the printed circuit board and the support member.

8. The portable communications terminal of claim 1, wherein the EMI shielding structure includes one or more spring fingers configured for contacting one or more electrically-conductive surfaces of the printed circuit board.

9. The portable communications terminal of claim 8, wherein the one or more spring fingers are formed from electrically-conductive material having sufficient resiliency for permitting the one or more spring fingers to be at least partially deflected and then to respond with a sufficient restorative force for biasing the one or more spring fingers against the one or more electrically-conductive surfaces of the printed circuit board, for maintaining good electrical contact with the one or more electrically-conductive surfaces of the printed circuit board.

10. The portable communications terminal of claim 1, further comprising:
    a user interface support member disposed between the front and back housing portions;
    a keypad supported by the user interface support member; and
    a display device supported by the user interface support member.

11. An assembly for a portable communications terminal including front and back housing portions and a printed circuit board having one or more electronic components mounted thereon, the assembly comprising:
    a support member;
    an antenna attached to the support member;
    electromagnetic interference (EMI) shielding structure attached to the support member;
    whereby, when the support member is adjacent the printed circuit board, and between the front and back housing portions, the EMI shielding structure is operable for providing EMI shielding for one or more electronic components that are disposed within the interior defined by the EMI shielding structure and the printed circuit board.

12. The assembly of claim 11, wherein the support member comprises a middle deck.

13. The assembly of claim 12, wherein:
the antenna is mounted to the middle deck without any direct physical attachment of the antenna to the printed circuit board; and
the EMI shielding structure is mounted to the middle deck without any direct physical attachment of the EMI shielding structure to the printed circuit board.

14. The assembly of claim 11, wherein:
the support member comprises an internal frame having an opening configured for receiving therein the EMI shielding structure; and
the antenna and EMI shielding structure are attached directly to the support member without any direct physical attachment to the printed circuit board; and
the EMI shielding structure and the support member are configured to form a snap-fit, interference fit, or friction fit connection therebetween.

15. The assembly of claim 11, wherein:
the support member includes generally oppositely facing first and second sides;
the antenna is attached directly to the first side of the support member; and
the EMI shielding structure is attached directly to the second side of the support member.

16. The assembly of claim 11, wherein:
the antenna and EMI shielding structure are attached directly to the support member with a spaced distance separating the antenna from the EMI shielding structure; and
the support member is dielectric; and
the antenna comprises a PIFA patch antenna having etched copper film that is attached to the support member.

17. The assembly of claim 11, wherein:
the EMI shielding structure comprises at least one resilient finger extending generally outwardly from the EMI shielding structure, for electrically contacting at least one electrically conductive surface of the printed circuit board; and
the EMI shielding structure includes a lid portion and plurality of walls depending from the lid portion; and
the EMI shielding structure defines two or more EMI shielding compartments corresponding to the layout of the electronic components of the printed circuit board, such that the electronic components are in different EMI shielding compartments; and
the EMI shielding structure is monolithically formed as a single component structure.

18. The assembly of claim 11, wherein the EMI shielding structure includes one or more spring fingers configured for contacting one or more electrically-conductive surfaces of the printed circuit board.

19. The assembly of claim 18, wherein the one or more spring fingers are formed from electrically-conductive material having sufficient resiliency for permitting the one or more spring fingers to be at least partially deflected and then to respond with a sufficient restorative force for biasing the one or more spring fingers against the one or more electrically-conductive surfaces of the printed circuit board, for maintaining good electrical contact with the one or more electrically-conductive surfaces of the printed circuit board.

20. A portable communications terminal including the assembly of claim 11.

21. A method relating to a portable communications terminal, the method comprising attaching electromagnetic interference (EMI) shielding structure directly to a support member for a portable communications terminal, an antenna for receiving and transmitting signals also being attached to the support member, whereby the EMI shielding structure is operable for providing EMI shielding for one or more electronic components of a printed circuit board of the portable communications terminal when the support member is adjacent the printed circuit board and between front and back housing portions of the portable communications terminal.

22. The method of claim 21, further comprising positioning the support member relative to the printed circuit board such that the EMI shielding structure provides EMI shielding for one or more electronic components of the printed circuit board.

23. The method of claim 22, wherein:
the EMI shielding structure defines two or more EMI shielding compartments corresponding to the layout of the electronic components of the printed circuit board, and wherein positioning includes the one or more electronic components being positioned in different EMI shielding compartments; and
the EMI shielding structure includes one or more spring fingers, and wherein the positioning includes contacting the one or more spring fingers with one or more electrically-conductive surfaces of the printed circuit board; and
positioning includes compressively sandwiching the EMI shielding structure between the support member and the printed circuit board.

24. The method of claim 21, wherein:
the EMI shielding structure defines two or more EMI shielding compartments corresponding to the layout of the electronic components of the printed circuit board; and
attaching include forming a snap-fit, interference fit, or friction fit connection between the EMI shielding structure and the support member; and
the EMI shielding structure is monolithically formed as a single component structure; and
the EMI shielding structure includes one or more spring fingers; and
the method further comprises comprising shipping the support member with EMI shielding structure and antenna attached thereto to a customer, without other components of the portable communications terminal; and
the method further comprises attaching the EMI shielding structure on a side of the support member opposite the side to which the antenna is attached.

25. A method relating to a portable communications terminal having front and back housing portions, the method comprising positioning a support member between the front and back housing portions relative to a printed circuit board of the portable communication terminal such that electromagnetic interference (EMI) shielding structure attached to the support member provides EMI shielding for one or more electronic components of the printed circuit board, the support member also supporting an antenna for receiving and transmitting signals also attached to the support member.

26. The method of claim 25, wherein:
the EMI shielding structure defines two or more EMI shielding compartments corresponding to the layout of the electronic components of the printed circuit board, and wherein positioning includes the one or more electronic components being positioned in different EMI shielding compartments; and
the EMI shielding structure includes one or more spring fingers, and wherein the positioning includes contacting the one or more spring fingers with one or more electrically-conductive surfaces of the printed circuit board; and positioning includes compressively sandwiching the EMI shielding structure between the support member and the printed circuit board; and the EMI shielding structure is monolithically formed as a single component structure; and the method further comprises shipping the support member with EMI shielding structure and antenna attached thereto to a customer, without other components of the portable communications terminal; and the EMI shielding structure is attached to a side of the support member opposite the side to which the antenna is attached.

* * * * *